United States Patent
Imamura et al.

(10) Patent No.: US 11,967,508 B2
(45) Date of Patent: Apr. 23, 2024

(54) DAMPER CONTROL SYSTEM AND DAMPER CONTROL METHOD

(71) Applicant: EBARA CORPORATION, Tokyo (JP)

(72) Inventors: Akira Imamura, Tokyo (JP); Mitsuru Miyazaki, Tokyo (JP); Junji Kunisawa, Tokyo (JP)

(73) Assignee: EBARA CORPORATION, Tokyo (JP)

( * ) Notice: Subject to any disclaimer, the term of this patent is extended or adjusted under 35 U.S.C. 154(b) by 246 days.

(21) Appl. No.: 17/607,999

(22) PCT Filed: May 29, 2020

(86) PCT No.: PCT/JP2020/021418
§ 371 (c)(1),
(2) Date: Nov. 1, 2021

(87) PCT Pub. No.: WO2020/241848
PCT Pub. Date: Dec. 3, 2020

(65) Prior Publication Data
US 2022/0319874 A1 Oct. 6, 2022

(30) Foreign Application Priority Data

May 30, 2019 (JP) .................................. 2019-101611

(51) Int. Cl.
*H01L 21/67* (2006.01)
*H01L 21/677* (2006.01)

(52) U.S. Cl.
CPC .... *H01L 21/67034* (2013.01); *H01L 21/6704* (2013.01); *H01L 21/67253* (2013.01); *H01L 21/67742* (2013.01)

(58) Field of Classification Search
CPC .......... Y10T 137/264; Y10T 137/2605; Y10T 137/7761; Y10T 137/87877;
(Continued)

(56) References Cited

U.S. PATENT DOCUMENTS 3,548,865 A * 12/1970 Povinger ................ F02M 19/01
318/609
4,375,224 A * 3/1983 Noll ........................ F24F 11/74
92/48
(Continued)

FOREIGN PATENT DOCUMENTS

JP     H06-163494 A     6/1994
JP     H11-290793 A     10/1999
(Continued)

OTHER PUBLICATIONS

International Search Report dated Aug. 18, 2020 issued in Patent Application No. PCT/JP2020/021418.

*Primary Examiner* — Matthew W Jellett
(74) *Attorney, Agent, or Firm* — PEARNE & GORDON LLP

(57) ABSTRACT

The present invention relates to a damper control system and a damper control method for controlling an opening degree of an exhaust damper connected to an exhaust duct. The damper control system (300) includes an exhaust damper (310), a first pressure sensor (311), and a controller (315) configured to control an opening degree of the exhaust damper (310). The controller (315) is configured to switch the opening degree of the exhaust damper (310) to an opening degree smaller than a full opening on condition that a shutter (217) is opened.

6 Claims, 8 Drawing Sheets

(58) Field of Classification Search
CPC ........... H01L 21/67253; H01L 21/6704; H01L 21/67034; H01L 21/67742; F24F 7/007
See application file for complete search history.

(56) References Cited

U.S. PATENT DOCUMENTS

| | | | | |
|---|---|---|---|---|
| 4,796,651 A * | 1/1989 | Ginn | ....................... | G01F 1/363 137/487 |
| 4,805,519 A * | 2/1989 | Boddey | ................ | F24F 11/0001 340/3.7 |
| 4,881,572 A * | 11/1989 | Bengtsson | ......... | G05D 23/1925 137/488 |
| 5,363,872 A * | 11/1994 | Lorimer | .................... | F16K 1/10 414/217 |
| 5,518,446 A * | 5/1996 | Jacob | ................... | B08B 15/023 137/486 |
| 5,758,680 A * | 6/1998 | Kaveh | .............. | G05D 16/2013 438/909 |
| 6,267,131 B1 * | 7/2001 | Masada | .............. | G05D 16/2013 137/12 |
| 6,557,574 B2 * | 5/2003 | Federspiel | ............... | F24F 11/74 137/12 |
| 8,499,549 B2 * | 8/2013 | Herges | .................... | F01N 1/165 137/115.18 |
| 8,851,106 B2 * | 10/2014 | Okabe | ............... | H01L 21/67017 137/115.11 |
| 9,465,391 B2 * | 10/2016 | Grumstrup | .............. | F16K 31/42 |
| 2013/0340860 A1 * | 12/2013 | Ogawa | ................ | G05D 7/0617 137/487.5 |

FOREIGN PATENT DOCUMENTS

| | | | |
|---|---|---|---|
| JP | H11-307499 A | | 11/1999 |
| JP | 2000-286219 A | | 10/2000 |
| JP | 2000286219 A | * | 10/2000 |
| JP | 2006-078086 A | | 3/2006 |
| JP | 2006078086 A | * | 3/2006 |
| JP | 2009-036425 A | | 2/2009 |
| JP | 2009036425 A | * | 2/2009 |
| JP | 2010-050436 A | | 3/2010 |

\* cited by examiner

*FIG. 4*
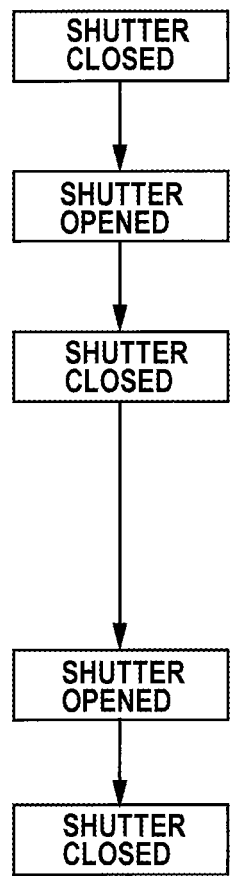
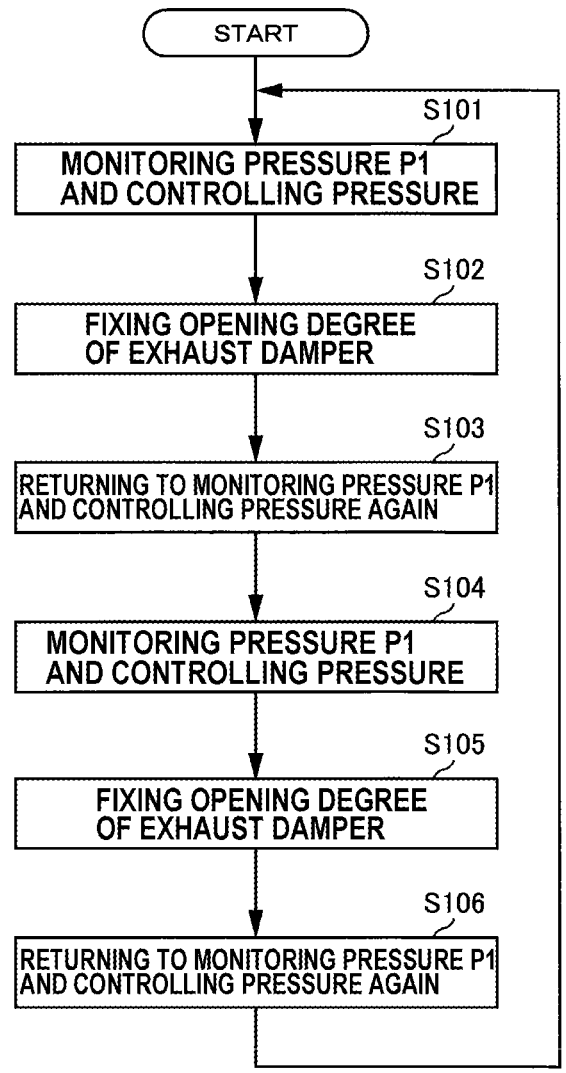

DAMPER CONTROL SYSTEM AND DAMPER CONTROL METHOD

TECHNICAL FIELD

The present invention relates to a damper control system and a damper control method for controlling an opening degree of an exhaust damper connected to an exhaust duct.

BACKGROUND ART

A structure that includes a partition wall between a space (i.e., positive pressure chamber) maintained at positive pressure and a space (i.e., negative pressure chamber) maintained at negative pressure is known. When a shutter provided on the partition wall is opened, an object to be transported is transported from the positive pressure chamber to the negative pressure chamber.

PATENT LITERATURE

Patent document 1: Japanese laid-open patent publication No. 2010-050436
Patent document 2: Japanese laid-open patent publication No. H11-307499
Patent document 3: Japanese laid-open patent publication No. H11-290793
Patent document 4: Japanese laid-open patent publication No. 2000-286219
Patent document 5: Japanese laid-open patent publication No. H06-163494

SUMMARY OF INVENTION

Technical Problem

FIG. 8 is a view for explaining a problem associated with pressure fluctuations in the negative pressure chamber. As shown in FIG. 8, when the shutter is opened, a gas in the positive pressure chamber flows into the negative pressure chamber. This causes the pressure in the negative pressure chamber to increase. In order to exhaust the negative pressure chamber, an exhaust damper connected to an exhaust duct is fully opened.

Thereafter, when the shutter is closed, an inflow of the gas from the positive pressure chamber is shut off. However, immediately after the shutter is closed, the exhaust damper is fully opened, so the pressure in the negative pressure chamber drops rapidly. As a result, a pressure fluctuation called an undershoot phenomenon occurs, and it takes a lot of time for the pressure in the negative pressure chamber to return to a predetermined pressure.

The object to be transported may be processed in the negative pressure chamber maintained at the predetermined pressure. If the undershoot phenomenon occurs, the object to be transported cannot be processed until the pressure in the negative pressure chamber reaches the predetermined pressure. As a result, a throughput of the entire process is reduced.

It is therefore an object of the present invention to provide a damper control system and a damper control method capable of preventing an occurrence of the undershoot phenomenon.

Solution to Problem

In an embodiment, there is provided a damper control system, comprising: an exhaust damper connected to an exhaust duct attached to a partition wall of a processing module, the exhaust damper being able to adjust an opening degree between full opening and full closing; a first pressure sensor arranged in an internal space of the partition wall; and a controller configured to control the opening degree of the exhaust damper based on a pressure measured by the first pressure sensor, and the controller being configured to switch the opening degree of the exhaust damper to an opening degree smaller than a full opening on condition that a shutter configured to open and close an opening formed to the partition wall is opened.

In an embodiment, the controller is configured to: control the opening degree of the exhaust damper based on a pressure measured by the first pressure sensor on condition that the shutter is closed; and fix the opening degree of the exhaust damper to a predetermined opening degree on condition that the shutter is opened.

In an embodiment, the damper control system further comprises a second pressure sensor arranged in the exhaust duct, and the controller is configured to: control the opening degree of the exhaust damper based on a pressure measured by the first pressure sensor on condition that the shutter is closed; and switch a monitoring target from the first pressure sensor to the second pressure sensor on condition that the shutter is opened.

In an embodiment, the controller controls the opening degree of the exhaust damper based on a pressure measured by the second pressure sensor after the shutter is opened and immediately before the shutter is closed.

In an embodiment, there is provided a damper control method for controlling an exhaust damper connected to an exhaust duct attached to a partition wall of a processing module, comprising: controlling an opening degree of the exhaust damper based on a pressure measured by a first pressure sensor arranged in an internal space of the partition wall; and switching the opening degree of the exhaust damper to an opening degree smaller than a full opening on condition that a shutter configured to open and close an opening formed to the partition wall is opened.

In an embodiment, the damper control method further comprising: controlling the opening degree of the exhaust damper based on the pressure measured by the first pressure sensor on condition that the shutter is closed; and fixing the opening degree of the exhaust damper to a predetermined opening degree on condition that the shutter is opened.

In an embodiment, the damper control method further comprising: controlling the opening degree of the exhaust damper based on the pressure measured by the first pressure sensor on condition that the shutter is closed; and switching a monitoring target from the first pressure sensor to a second pressure sensor arranged in the exhaust duct on condition that the shutter is opened.

In an embodiment, the damper control method further comprising: controlling the opening degree of the exhaust damper based on a pressure measured by the second pressure sensor after the shutter is opened and immediately before the shutter is closed.

Advantageous Effects of Invention

According to the present invention, even if the shutter is closed after the shutter is opened, the pressure in an internal space of the processing module does not drop rapidly and the undershoot phenomenon does not occur. Therefore, the processing module can perform processing of the object to be transported (e.g., wafer) immediately after the object is transported to the processing module. As a result, the damper control system can increase the throughput of the entire process.

BRIEF DESCRIPTION OF DRAWINGS

FIG. 4 is a view showing an embodiment of operation sequences of a controller;

DESCRIPTION OF EMBODIMENTS

Figure 1:
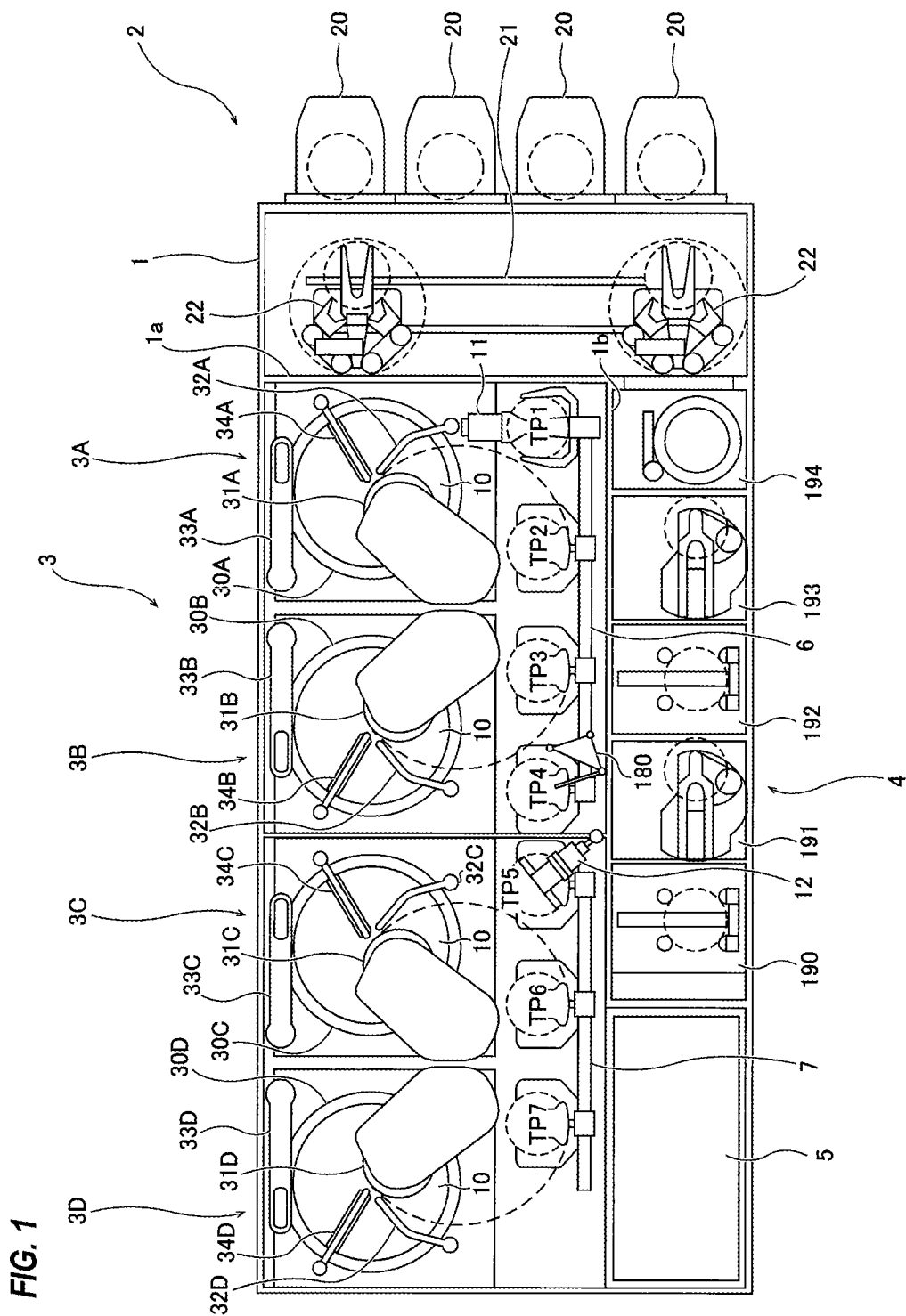
FIG. 1 is a plan view showing an embodiment of a semiconductor manufacturing apparatus.

Embodiments will be described below with reference to the drawings. In the drawings described below, identical or equivalent components are marked with the same sign to omit redundant explanations.

FIG. 1 is a plan view showing an embodiment of a semiconductor manufacturing apparatus. As shown in FIG. 1, the semiconductor manufacturing apparatus includes a rectangular-shaped housing 1. An inside of the housing 1 is divided into a load/unload unit 2, a polishing unit 3, and a cleaning unit 4 by partition walls 1a and 1b. The load/unload unit 2, the polishing unit 3, and the cleaning unit 4 are assembled independently, and exhausted independently. Further, the semiconductor manufacturing apparatus includes a controller 5 for controlling a substrate processing operation.

The load/unload unit 2 includes two or more (four in this embodiment) front load sections 20 on which wafer cassettes for stocking a large number of wafers (substrates) are placed. These front load sections 20 are arranged adjacent to the housing 1 and are arranged along a width direction (i.e., direction perpendicular to a longitudinal direction) of the semiconductor manufacturing apparatus. An open cassette, a SMIF (Standard Manufacturing Interface) pod, or a FOUP (Front Opening Unified Pod) can be mounted on the front load sections 20.

The load/unload section 2 includes a moving mechanism 21 extending along an arrangement direction of the front load section 20. Two transport robots (loader, transport mechanism) 22 capable of moving along an arrangement direction of the wafer cassettes are installed on the moving mechanism 21. The transport robot 22 can access the wafer cassettes mounted on the front load section 20 by moving on the moving mechanism 21.

The polishing unit 3 is a region where the wafer is polished (flattened), and includes a first polishing unit 3A, a second polishing unit 3B, a third polishing unit 3C, and a fourth polishing unit 3D. As shown in FIG. 1, these first polishing unit 3A, second polishing unit 3B, third polishing unit 3C, and fourth polishing unit 3D are arranged along the longitudinal direction of the semiconductor manufacturing apparatus.

As shown in FIG. 1, the first polishing unit 3A includes a polishing table 30A to which a polishing pad 10 having a polishing surface is attached, a top ring 31A for holding the wafer and polishing the wafer while pressing the wafer against the polishing pad 10 on the polishing table 30A, a polishing-liquid supply nozzle 32A for supplying a polishing liquid or a dressing liquid (e.g., pure water) onto the polishing pad 10, a dresser 33A for dressing the polishing surface of the polishing pad 10, and an atomizer 34A for atomizing a mixture of liquid (e.g., pure water) and a gas (e.g., nitrogen gas) or liquid (e.g., pure water) and spraying it onto the polishing surface.

Similarly, the second polishing unit 3B includes a polishing table 30B, a top ring 31B, a polishing-liquid supply nozzle 32B, a dresser 33B, and an atomizer 34B. The third polishing unit 3C includes a polishing table 30C, a top ring 31C, a polishing-liquid supply nozzle 32C, a dresser 33C, and an atomizer 34C. The fourth polishing unit 3D includes a polishing table 30D, a top ring 31D, a polishing-liquid supply nozzle 32D, a dresser 33D, and an atomizer 34D.

Next, the transport mechanism for transporting the wafer will be described. As shown in FIG. 1, a first linear transporter 6 is arranged adjacent to the first and second polishing units 3A and 3B. The first linear transporter 6 is a mechanism for transporting the wafer between four transport positions along a direction in which the polishing units 3A and 3B are arranged (a first transport position TP1, a second transport position TP2, a third transport position TP3, and a fourth transport position TP4 in order from the load/unload unit side).

A second linear transporter 7 is arranged adjacent to the third and fourth polishing units 3C and 3D. The second linear transporter 7 is a mechanism for transporting the wafer between three transport positions along a direction in which the polishing units 3C and 3D are arranged (a fifth transport position TP5, a sixth transport position TP6, and a seventh transport position TP7 in order from the load/unload unit side).

The wafer is transported to the polishing units 3A and 3B by the first linear transporter 6. The top ring 31A of the first polishing unit 3A moves between a polishing position and the second transport position TP2 by a swinging motion of a top ring head. Therefore, a transfer of the wafer to the top ring 31A is performed at the second transport position TP2.

Similarly, the top ring 31B of the second polishing unit 3B moves between the polishing position and the third transport position TP3, and the transfer of the wafer to the top ring 31B is performed at the third transport position TP3. The top ring 31C of the third polishing unit 3C moves between the polishing position and the sixth transport position TP6, and the transfer of the wafer to the top ring 31C is performed at the sixth transport position TP6. The top ring 31D of the fourth polishing unit 3D moves between the polishing position and the seventh transport position TP7, and the transfer of the wafer to the top ring 31D is performed at the seventh transport position TP7.

A lifter 11 for receiving the wafer from the transport robot 22 is arranged at the first transport position TP1. The wafer is passed from the transport robot 22 to the first linear transporter 6 via the lifter 11. A shutter (not shown) is provided on the partition wall 1a so as to be located between the lifter 11 and the transport robot 22. When the wafer is transported, the shutter is opened so that the wafer is transported from the transport robot 22 to the lifter 11.

A swing transporter 12 is arranged between the first linear transporter 6, the second linear transporter 7, and the cleaning unit 4. The swing transporter 12 has a hand capable of moving between the fourth transport position TP4 and the fifth transport position TP5. The transfer of wafers from the first linear transporter 6 to the second linear transporter 7 is performed by the swing transporter 12. The wafer is transported by the second linear transporter 7 to the third polishing unit 3C and/or the fourth polishing unit 3D. The wafer that has been polished in the polishing unit 3 is also transported to the cleaning unit 4 via the swing transporter 12.

Figure 2A:
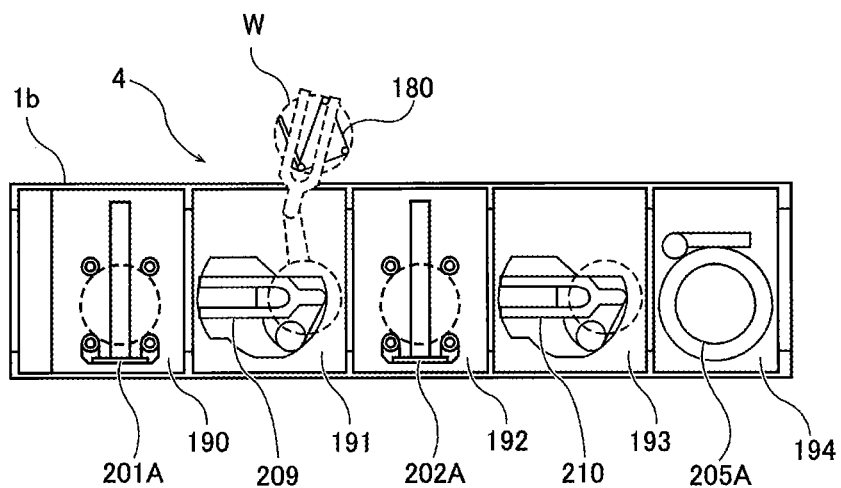
FIG. 2A is a plan view showing a cleaning unit.
Figure 2B:
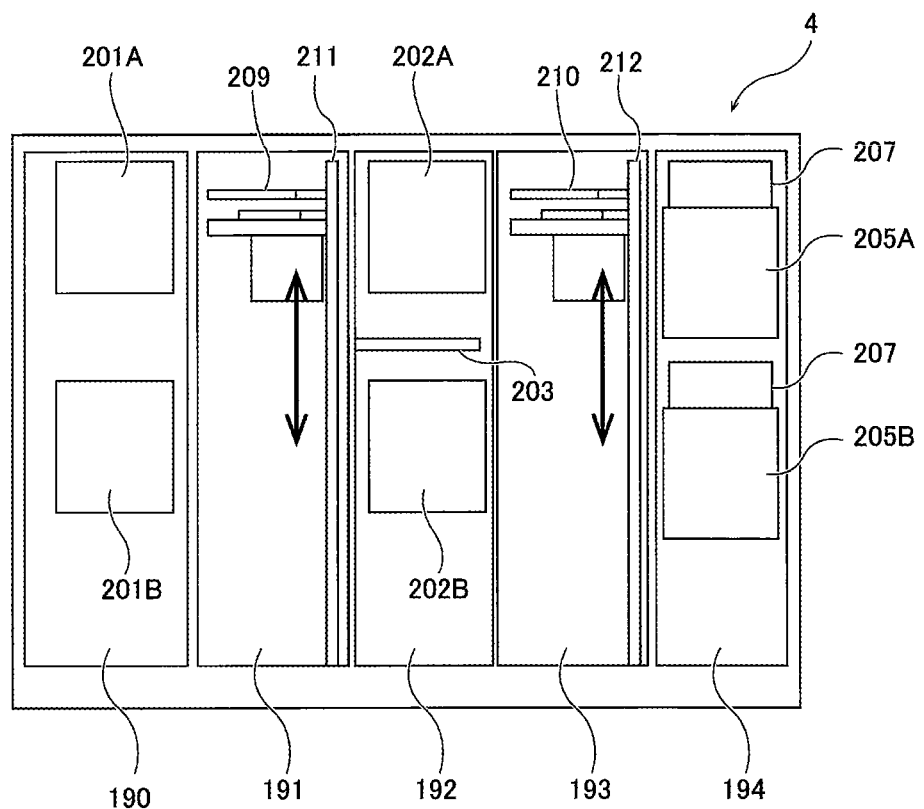
FIG. 2B is a side view showing the cleaning unit.

FIG. 2A is a plan view showing the cleaning unit 4, and FIG. 2B is a side view showing the cleaning unit 4. As shown in FIGS. 2A and 2B, the cleaning unit 4 is divided into a first cleaning chamber 190, a first transport chamber 191, a second cleaning chamber 192, a second transport chamber 193, and a drying chamber 194.

An upper primary cleaning module 201A and a lower primary cleaning module 201B, arranged along a vertical direction, are arranged in the first cleaning chamber 190. The upper primary cleaning module 201A is arranged above the lower primary cleaning module 201B. Similarly, an upper secondary cleaning module 202A and a lower secondary cleaning module 202B, arranged along the vertical direction, are arranged in the second cleaning chamber 192. The upper secondary cleaning module 202A is arranged above the lower secondary cleaning module 202B.

The primary and secondary cleaning modules 201A, 201B, 202A, 202B are cleaning machines for cleaning the wafer using a cleaning liquid. Since these primary and secondary cleaning modules 201A, 201B, 202A, 202B are arranged along the vertical direction, an advantage of a small footprint area can be obtained.

A temporary stand 203 for the wafer is provided between the upper secondary cleaning module 202A and the lower secondary cleaning module 202B. An upper drying module 205A and a lower drying module 205B, arranged along the vertical direction, are arranged in the drying chamber 194. The upper drying module 205A and the lower drying module 205B are isolated from each other.

Fan filter units (FFU) 207, 207 for supplying a clean air into the drying modules 205A and 205B are provided above the upper drying module 205A and the lower drying module 205B, respectively.

A first transport robot (transport mechanism) 209 capable of moving up and down is arranged in the first transport chamber 191. A second transport robot 210 capable of moving up and down is arranged in the second transport chamber 193. The first transport robot 209 and the second transport robot 210 are movably supported by support shafts 211, 212 extending in the vertical direction, respectively.

The first transport robot 209 and the second transport robot 210 each have a drive mechanism such as a motor inside thereof, and are movable up and down along the support shafts 211, 212. The first transport robot 209, as with the transport robot 22, has two upper and lower hands. The first transport robot 209 is arranged at a position where the lower hand of the first transport robot 209 can access a temporary stand 180 described above (see a dotted line in FIG. 2A).

The first transport robot 209 operates so as to transport the wafer W between the temporary stand 180, the upper primary cleaning module 201A, the lower primary cleaning module 201B, the temporary stand 203, the upper secondary cleaning module 202A, and the lower secondary cleaning module 202B.

The second transport robot 210 operates so as to transport the wafer W between the upper secondary cleaning module 202A, the lower secondary cleaning module 202B, the temporary stand 203, the upper drying module 205A, and the lower drying module 205B.

The transport robot 22 shown in FIG. 1 takes out the wafer from the upper drying module 205A or the lower drying module 205B by using the upper hand of the transport robot 22, and returns the wafer to the wafer cassette.

Figure 3:
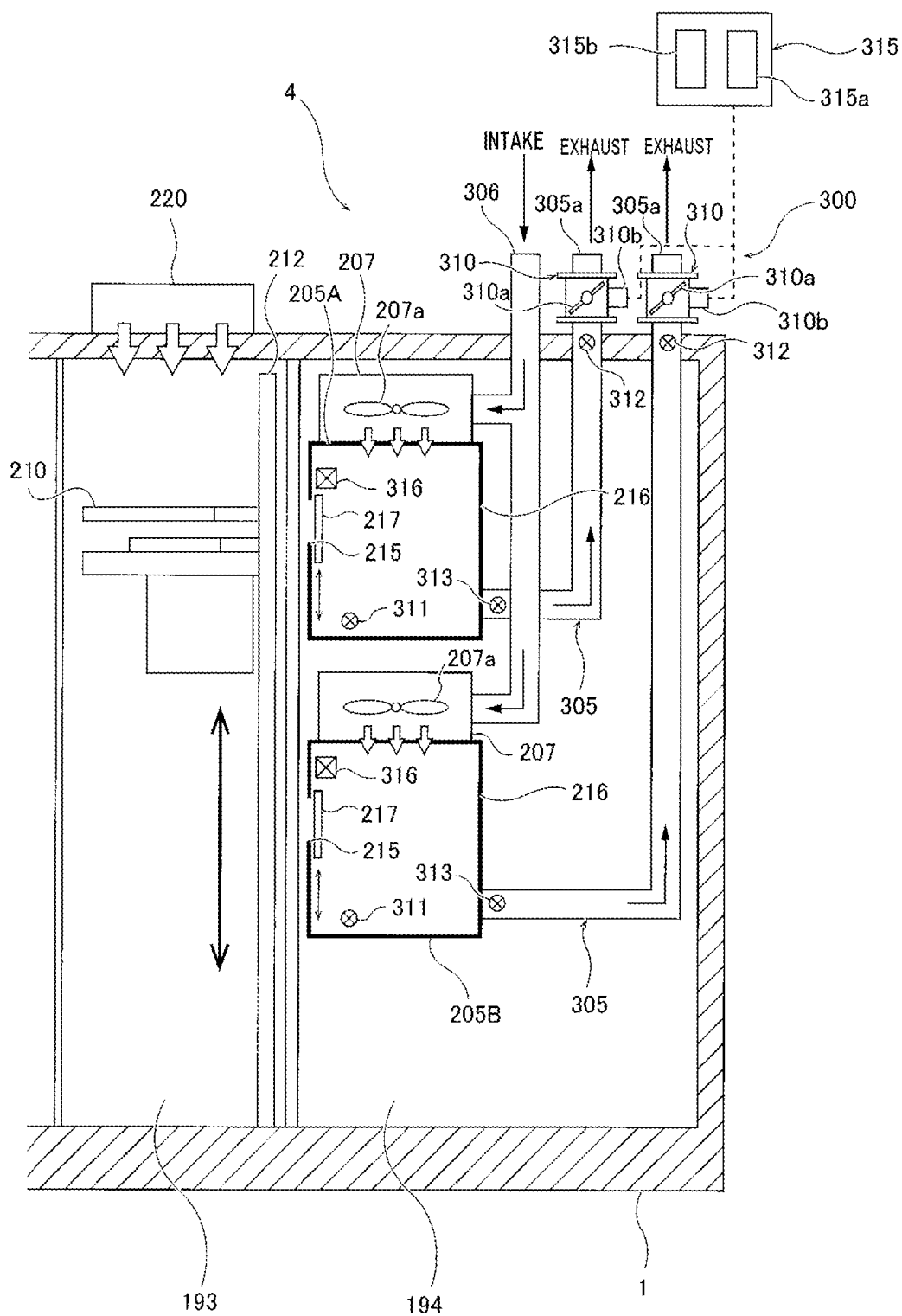
FIG. 3 is a view showing an embodiment of a damper control system.

In the specification, the cleaning modules 201A, 201B, 202A, 202B and the drying modules 205A, 205B may be referred to as processing modules without distinction. FIG. 3 is a view showing an embodiment of a damper control system 300. As shown in FIG. 3, the cleaning unit 4 of the semiconductor manufacturing apparatus includes the damper control system 300 for controlling a pressure in the processing module.

Configurations of the damper control system 300 for controlling the pressure in each of the drying modules 205A, 205B as the processing module will be described with reference to the drawings. The damper control system 300 may be configured to control the pressure in each of the cleaning modules 201A, 201B, 202A, 202B as a processing module.

As shown in FIG. 3, the processing module (in the embodiment shown in FIG. 3, each of the drying modules 205A, 205B) includes a partition wall 216 having an opening 215 formed therein, and a shutter 217 for opening and closing the opening 215. The partition wall 216 stores components necessary for processing the wafer W. The opening 215 has a size through which the wafer W can pass. When the shutter 217 is opened, the transport robot 210 makes the wafer W access the above components through the opening 215.

The pressure in the transport chamber 193 in which the transport robot 210 is arranged is larger than the pressure in the partition wall 216. A fan filter unit (FFU) 220 for supplying the clean air into the transport chamber 193 is provided above the transport chamber 193. When the fan filter unit 220 is driven, the clean air flows into the transport chamber 193, and the pressure in the transport chamber 193 becomes a positive pressure.

An exhaust duct 305 for exhausting an internal space of the partition wall 216 is connected to the partition wall 216. The exhaust duct 305 includes an exhaust port 305a arranged outside the housing 1. The exhaust duct 305 is connected to a suction source arranged outside the semiconductor manufacturing apparatus. Therefore, the internal space of the partition wall 216 is exhausted through the exhaust duct 305, and the pressure inside the partition wall 216 becomes a negative pressure.

As shown in FIG. 3, an intake pipe 306 is connected to the fan filter units 207, 207. When a fan 207a provided in each of the fan filter units 207, 207 rotates, the air outside the housing 1 is sucked into the fan filter unit 207 through the intake pipe 306. The clean air that has passed through the fan filter unit 207 is sent to the internal space of the partition wall 216. Normally, a rotational speed of the fan 207a is kept constant so that the pressure in the partition wall 216 becomes a negative pressure.

The damper control system 300 includes an exhaust damper 310 which is connected to the exhaust duct 305 and whose opening degree can be adjusted between full opening and full closing, a first pressure sensor 311 arranged in the internal space of the partition wall 216, and a controller 315 for controlling the opening degree of the exhaust damper 310 based on the pressure measured by the pressure sensor 311.

In this embodiment, the exhaust damper 310 is arranged outside the housing 1. The exhaust damper 310 has a partition plate 310a therein. The partition plate 310a has a size for being able to adjust a size of a flow path of the exhaust duct 305, and is connected to a motor 310b for operating the partition plate 310a.

The exhaust damper 310 is electrically connected to the controller 315. The exhaust damper 310 is an auto damper that can be controlled by the controller 315. The exhaust damper 310 operates the partition plate 310a via the motor 310b based on a command from the controller 315 to adjust the size of the flow path of the exhaust duct 305. In this manner, the controller 315 controls the opening degree of the exhaust damper 310.

The processing module is provided with an open/close sensor 316 for detecting an opening and closing of the shutter 217. The open/close sensor 316 is electrically connected to the controller 315. The controller 315 determines the opening and closing of the shutter 217 based on a signal sent from the open/close sensor 316.

The controller 315 includes a memory 315a that stores a program for controlling the opening degree of the exhaust damper 310, and a processer 315b that executes a calculation according to the program. The controller 315 may be the same as the controller 5 described above.

Figure 8:
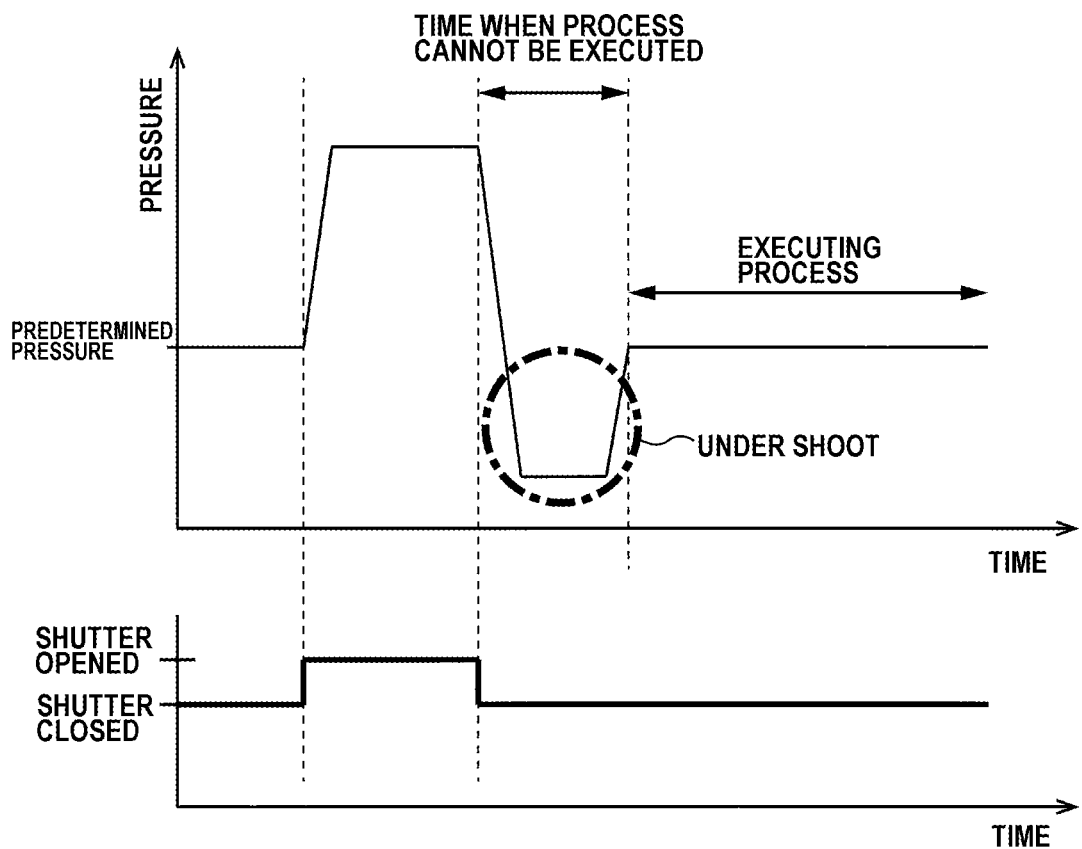
FIG. 8 is a view for explaining a problem associated with pressure fluctuations in a negative pressure chamber.

The internal space of the partition wall 216 is maintained in a negative pressure state. When the shutter 217 is opened, a gas in the transport chamber 193 flows into the processing module. As described above, if the shutter 217 is closed while the opening degree of the exhaust damper 310 is fully opened, the internal space of the partition wall 216 is exhausted at once. As a result, the undershoot phenomenon occurs (see FIG. 8). Therefore, in the embodiment, the controller 315 is configured to switch the opening degree of the exhaust damper 310 to an opening degree smaller than the full opening on condition of switching the opening and closing of the shutter 217.

In other words, the above program includes a command to switch the opening degree of the exhaust damper 310 to the opening degree smaller than the full opening on condition of switching the opening and closing of the shutter 217. Further, in other words, the above program causes the exhaust damper 310 to perform an operation of switching the opening degree of the exhaust damper 310 to the opening degree smaller than the full opening on condition of switching the opening and closing of the shutter 217.

FIG. 4 is a view showing an embodiment of operation sequences of the controller 315. As shown in step S101 of FIG. 4, when the shutter 217 is closed, the controller 315 controls the opening degree of the exhaust damper 310 based on a pressure P1 in the partition wall 216 measured by the first pressure sensor 311.

In the embodiment, the controller 315 calculates a difference between a predetermined set pressure and the pressure P1, and feedback-controls (more specifically, PID control) the opening degree of the exhaust damper 310 based on the difference. The controller 315 increases the opening degree of the exhaust damper 310 to increase an amount of exhaust air of the internal space of the partition wall 216. Therefore, the pressure inside the partition wall 216 becomes small under a condition that an amount of intake air into the internal space of the partition wall 216 is constant.

The controller 315 decreases the opening degree of the exhaust damper 310 to decrease the amount of exhaust air of the internal space of the partition wall 216. Therefore, the pressure inside the partition wall 216 becomes large under the condition that the amount of intake air into the internal space of the partition wall 216 is constant.

As shown in step S102 of FIG. 4, when the shutter 217 is opened, the open/close sensor 316 sends a signal indicating that the shutter 217 is opened to the controller 315. When the controller 315 receives the signal from the open/close sensor 316, the controller 315 switches the opening degree of the exhaust damper 310 to a predetermined opening degree. The predetermined opening degree is smaller than the fully opening.

In the embodiment shown in FIG. 4, the controller 315 fixes the opening degree of the exhaust damper 310 to a predetermined opening degree on condition that the shutter 217 is opened. In this state, the transfer robot 210 transfers the wafer W to the processing module through the opening 215.

When the shutter 217 is closed after the wafer W is transported, the controller 315 returns to a monitoring of the pressure P1 to control the opening degree of the exhaust damper 310 again based on the pressure P1 (see step S103). In this manner, when the shutter 217 is opened, the controller 315 releases the feedback control of the exhaust damper 310. When the shutter 217 is closed, the controller 315 starts the feedback control of the exhaust damper 310.

Figure 5:
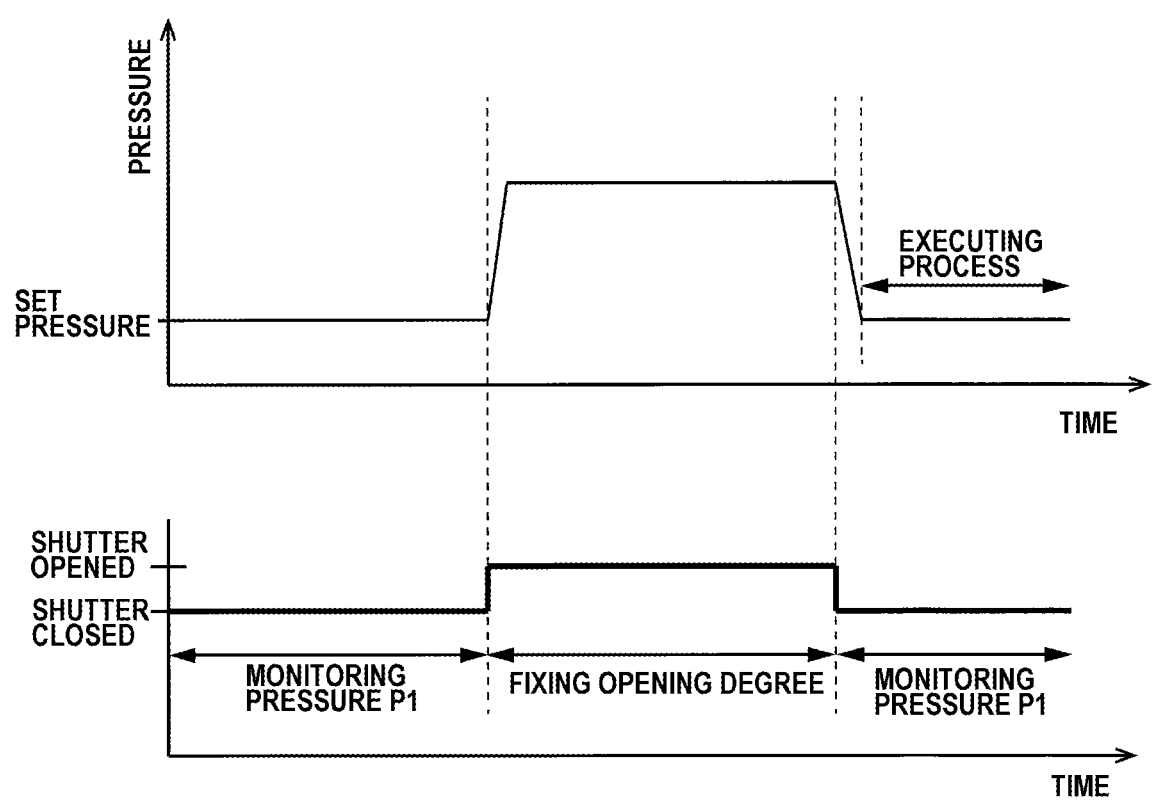
FIG. 5 is a view showing an effect of a damper control method shown in FIG. 4.

FIG. 5 is a view showing an effect of the damper control method shown in FIG. 4. According to the embodiment, even if the shutter 217 is opened and the pressure in the internal space of the partition wall 216 increases rapidly, the controller 315 maintains an opening degree of the exhaust damper 310 at a smaller than the full opening without fully opening.

Therefore, even if the shutter 217 is closed again, the pressure inside the partition wall 216 does not drop rapidly, and the undershoot phenomenon does not occur. As a result, the time required for the pressure in the partition wall 216 to reach the set pressure is shortened, and the processing module can execute the processing of the wafer W immediately after transporting the wafer W (more specifically, immediately after closing the shutter 217). In this manner, the damper control system 300 can improve the throughput of the entire process.

Returning to FIG. 4, when the processing module is processing the wafer W, the controller 315 continuously controls the opening degree of the exhaust damper 310 based on the pressure P1 (see step S104). When the shutter 217 is opened again after processing the wafer W, the controller 315 executes the same operation as in step S102 (see step S105). In this state, the transport robot 210 takes out the wafer W from the processing module through the opening 215. When the shutter 217 is closed, the controller 315 executes the same operation as in step S103 (see step S106).

As shown in FIG. 3, the damper control system 300 may include a second pressure sensor 312 and a third pressure sensor 313 arranged inside the exhaust duct 305. These pressure sensors 312, 313 are electrically connected to the controller 315. The second pressure sensor 312 is arranged adjacent to the exhaust damper 310, and the third pressure sensor 313 is arranged adjacent to the partition wall 216.

In the above-described embodiment, the controller 315 is configured to control the opening degree of the exhaust damper 310 based on the pressure P1. In one embodiment, the controller 315 may control the opening degree of the exhaust damper 310 based on the pressure P2 measured by the second pressure sensor 312. In one embodiment, the controller 315 may control the opening degree of the exhaust damper 310 based on the pressure P3 measured by the third pressure sensor 313.

In the above-described embodiment, the controller 315 is configured to control the opening degree of the exhaust damper 310. In one embodiment, the controller 315 may be configured to control a rotational speed of the fan 207a of the fan filter unit 207 based on any of the pressures P1, P2, P3.

The fan filter unit 207 is electrically connected to the controller 315. As the rotational speed of the fan 207a increases, the flow rate of the gas flowing into the partition wall 216 increases. Therefore, the pressure in the partition wall 216 becomes large under the condition that the amount of exhaust air of the internal space of the partition wall 216 is constant. When the rotational speed of the fan 207a decreases, the flow rate of the gas flowing into the partition wall 216 is reduced. Therefore, the pressure in the partition wall 216 becomes small under the condition that the amount of exhaust air of the internal space of the partition wall 216 is constant.

In this manner, there is a correlation between the pressure in the partition wall 216, the rotational speed of the fan 207a, and the opening degree of the exhaust damper 310. Data indicating this correlation is stored in the memory 315a of the controller 315. The controller 315 may control at least one of the rotational speed of the fan 207a and the opening degree of the exhaust damper 310 based on the above data.

Figure 6:
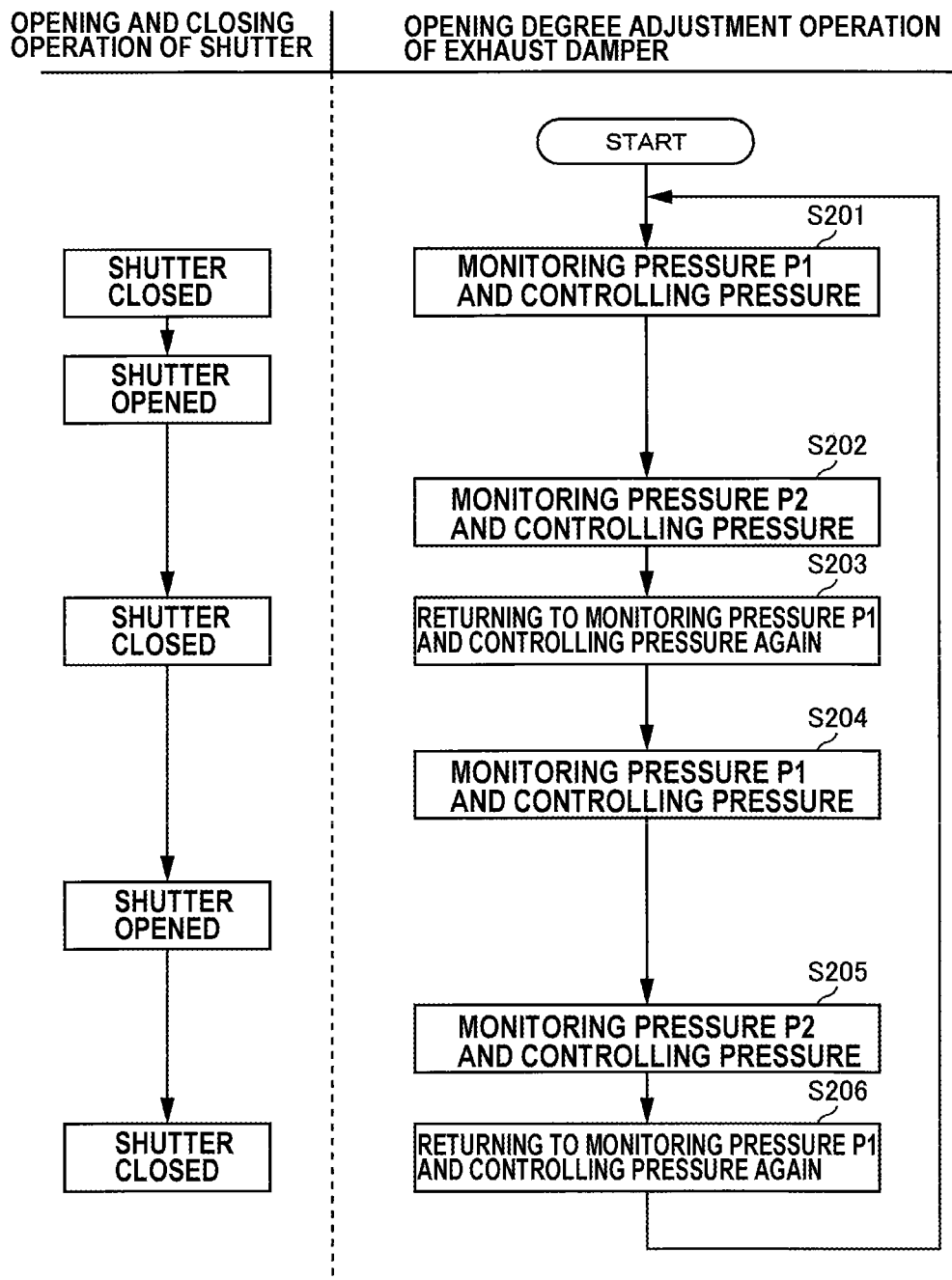
FIG. 6 is a view showing another embodiment of the operation sequences of the controller.

FIG. 6 is a view showing another embodiment of the operation sequences of the controller 315. As shown in step S201 of FIG. 6, when the shutter 217 is closed, the controller 315 controls the opening degree of the exhaust damper 310 based on the pressure P1, as in step S101 of FIG. 4.

As shown in step S202 of FIG. 6, after the shutter 217 is opened, the controller 315 continuously controls the opening degree of the exhaust damper 310 for a certain period of time based on the pressure P1. The controller 315 switches a monitoring target of the pressure control from the first pressure sensor 311 to the second pressure sensor 312 (see FIG. 3) on the condition that the shutter 217 is opened. In one embodiment, this switching operation is performed after the shutter 217 is opened and just before the shutter 217 is closed.

By performing such the switching operation, the controller 315 controls the opening degree of the exhaust damper 310 based on the pressure P2 measured by the second pressure sensor 312 before the shutter 217 is closed. Therefore, even if the pressure in the partition wall 216 increases, the controller 315 can control the opening degree of the exhaust damper 310 without being affected by a pressure fluctuation in the partition wall 216.

Figure 7:
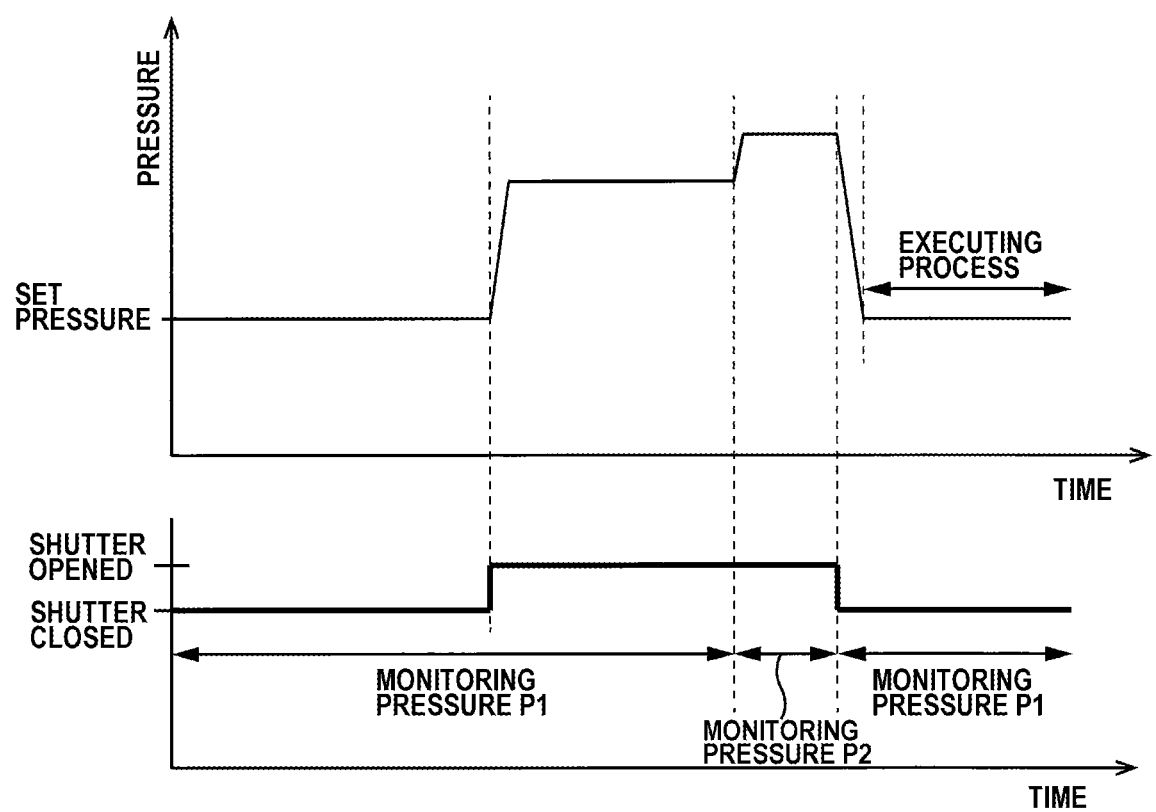
FIG. 7 is a view showing the effect of the damper control method shown in FIG. 6.

FIG. 7 is a view showing the effect of the damper control method shown in FIG. 6. The second pressure sensor 312 is arranged in the exhaust duct 305 at a position closest to a suction source. The pressure P2 measured by the second pressure sensor 312 is not affected by the pressure fluctuation in the partition wall 216 unlike the pressure P1. Therefore, when the controller 315 switches the monitoring target of the pressure control to the second pressure sensor 312, the opening degree of the exhaust damper 310 is not fully opened, but is smaller than the fully opening.

According to the embodiment, the controller 315 switches the opening degree of the exhaust damper 310 to the opening degree smaller than that of the fully open without fully opening the exhaust damper 310. Therefore, even if the shutter 217 is closed again, the pressure inside the partition wall 216 does not drop rapidly, and the undershoot phenomenon does not occur.

Returning to FIG. 6, when the shutter 217 is closed, the controller 315 returns to monitoring the pressure P1 and executes the same operation as in step S103 of FIG. 4 (see step S203). Thereafter, the controller 315 executes the same operation as in step S104 of FIG. 4 (see step S204). After the shutter 217 is opened and immediately before the shutter 217 is closed, the monitoring target of the pressure control is switched from the first pressure sensor 311 to the second pressure sensor 312 (see step S205). When the shutter 217 is closed, the controller 315 switches the monitoring target of the pressure control from the second pressure sensor 312 to the first pressure sensor 311 (see step S206).

Although specific description will be omitted, in the embodiment shown in FIG. 6, the controller 315 may execute the same control as the control in the embodiment shown in FIG. 4 as much as possible. For example, the controller 315 may be configured to control the rotational speed of the fan 207a of the fan filter unit 207.

The previous description of embodiments is provided to enable a person skilled in the art to make and use the present invention. Moreover, various modifications to these embodiments will be readily apparent to those skilled in the art, and the generic principles and specific examples defined herein may be applied to other embodiments. Therefore, the present invention is not intended to be limited to the embodiments described herein but is to be accorded the widest scope as defined by limitation of the claims.

INDUSTRIAL APPLICABILITY

The present invention is applicable to a damper control system and a damper control method for controlling an opening degree of an exhaust damper connected to an exhaust duct.

REFERENCE SIGNS LIST 1 housing
1a, 1b partition wall
2 load/unload unit
3 polishing unit
4 cleaning unit
6 first linear transporter
7 second linear transporter
10 polishing pad
11 lifter
12 swing transporter
20 front load section
21 moving mechanism
22 transport robot
30A,30B,30C,30D polishing table
31A,31B,31C,31D top ring
32A,32B,32C,32D polishing-liquid supply nozzle
33A,33B,33C,33D dresser
34A,34B,34C,34D atomizer
180 temporary stand
190 first cleaning chamber
191 first transport chamber
192 second cleaning chamber
193 second transport chamber
194 dry chamber
201A upper primary cleaning module
201B lower primary cleaning module
202A upper secondary cleaning module
202B lower secondary cleaning module
203 temporary stand
205A upper drying module
205B lower drying module
207 fan filter unit 207a fan
209 first transport robot
210 second transport robot
211,212 support shaft
215 opening
216 partition wall
217 shutter
220 fan filter unit
300 damper control system
305 exhaust duct
305a exhaust port
310 exhaust damper
310a partition plate
310b motor
311 first pressure sensor
312 second pressure sensor
313 third pressure sensor
315 controller
315a memory
315b processor
316 open/close sensor

The invention claimed is:

1. A damper control system, comprising:
an exhaust damper connected to an exhaust duct attached to a partition wall of a processing module, the exhaust damper being able to adjust an opening degree between full opening and full closing;
a first pressure sensor arranged in an internal space of the partition wall; and
a controller configured to control the opening degree of the exhaust damper based on a pressure measured by the first pressure sensor, and the controller being configured to switch the opening degree of the exhaust damper to an opening degree smaller than a full opening on condition that a shutter configured to open and close an opening formed to the partition wall is opened,
wherein the damper control system further comprises a second pressure sensor arranged in the exhaust duct, and
wherein the controller is configured to:
control the opening degree of the exhaust damper based on a pressure measured by the first pressure sensor on condition that the shutter is closed; and
switch a monitoring target from the first pressure sensor to the second pressure sensor on condition that the shutter is opened.

2. The damper control system according to claim 1, wherein the controller is configured to:
fix the opening degree of the exhaust damper to a predetermined opening degree on condition that the shutter is opened.

3. The damper control system according to claim 1, wherein the controller controls the opening degree of the exhaust damper based on a pressure measured by the second pressure sensor after the shutter is opened and immediately before the shutter is closed.

4. A damper control method for controlling an exhaust damper connected to an exhaust duct attached to a partition wall of a processing module, comprising:
controlling an opening degree of the exhaust damper based on a pressure measured by a first pressure sensor arranged in an internal space of the partition wall;
switching the opening degree of the exhaust damper to an opening degree smaller than a full opening on condition that a shutter configured to open and close an opening formed to the partition wall is opened,
controlling the opening degree of the exhaust damper based on the pressure measured by the first pressure sensor on condition that the shutter is closed; and
switching a monitoring target from the first pressure sensor to a second pressure sensor arranged in the exhaust duct on condition that the shutter is opened.

5. The damper control method according to claim 4, further comprising:
fixing the opening degree of the exhaust damper to a predetermined opening degree on condition that the shutter is opened.

6. The damper control method according to claim 4, further comprising: controlling the opening degree of the exhaust damper based on a pressure measured by the second pressure sensor after the shutter is opened and immediately before the shutter is closed.

* * * * *